(12) United States Patent
Sheng et al.

(10) Patent No.: US 10,540,919 B2
(45) Date of Patent: Jan. 21, 2020

(54) PROBE ASSEMBLY AND DETECTING DEVICE COMPRISING THE SAME

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Huapeng Sheng, Beijing (CN); Song Wu, Beijing (CN); Lin Zhang, Beijing (CN); Chuanbing Wei, Beijing (CN); Linshan Tian, Beijing (CN)

(73) Assignees: BOE TECHNOLOGY GROUP CO., LTD., Beijing (CN); HEFEI XINSHENG OPTOELECTRONICS TECHNOLOGY CO., LTD, Hefei, Anhui (CN)

( * ) Notice: Subject to any disclaimer, the term of this patent is extended or adjusted under 35 U.S.C. 154(b) by 327 days.

(21) Appl. No.: 14/889,279

(22) PCT Filed: Apr. 20, 2015

(86) PCT No.: PCT/CN2015/076956
§ 371 (c)(1),
(2) Date: Nov. 5, 2015

(87) PCT Pub. No.: WO2016/082439
PCT Pub. Date: Jun. 2, 2016

(65) Prior Publication Data
US 2016/0351091 A1 Dec. 1, 2016

(30) Foreign Application Priority Data
Nov. 24, 2014 (CN) .......................... 2014 1 0686133

(51) Int. Cl.
*G09G 3/00* (2006.01)
*G01R 1/067* (2006.01)
*G09G 3/36* (2006.01)

(52) U.S. Cl.
CPC ............. *G09G 3/006* (2013.01); *G01R 1/067* (2013.01); *G09G 3/36* (2013.01)

(58) Field of Classification Search
CPC .......... G09G 3/006; G09G 3/36; G01R 1/067; G01R 1/07307
See application file for complete search history.

(56) References Cited

U.S. PATENT DOCUMENTS

| 6,450,469 | B1 * | 9/2002 | Okuno | ................... | G09G 3/006 248/287.1 |
| 2004/0100287 | A1 * | 5/2004 | Taquchi | ................. | G09G 3/006 324/678 |

(Continued)

FOREIGN PATENT DOCUMENTS

| CN | 101236310 A | 8/2008 |
| CN | 101883986 A | 11/2010 |

(Continued)

OTHER PUBLICATIONS

International Search Report & Written Opinion Appln. No. PCT/CN2015/076956; dated Aug. 21, 2015.

(Continued)

*Primary Examiner* — Patrick Assouad
*Assistant Examiner* — Feba Pothen
(74) *Attorney, Agent, or Firm* — Ladas & Parry LLP

(57) ABSTRACT

A probe assembly and a detecting device including the same, the probe assembly is configured to detect the display panel and includes a first probe region corresponding to leads of the display panel, wherein a location in the first probe region corresponding to a first lead among the leads connected in (Continued)

2 the display panel is provided with a probe, and a location in the first probe region corresponding to a lead adjacent to the first lead is not provided with a probe; wherein the first lead is any one of the leads which are connected. The detecting device comprises the probe assembly. It solves the problem that the currently known probe assembly may result in short-circuit between adjacent probes when used for display panel detection, avoids the condition where a detective display panel cannot be detected, improves the detection rate, ensures the image quality of the display panel, and hence avoids a waste of production material and reduces the production cost.

16 Claims, 2 Drawing Sheets

(56) References Cited

U.S. PATENT DOCUMENTS

2007/0296453 A1  12/2007  Ootaguro et al.
2010/0301888 A1  12/2010  Yonezawa et al.
2014/0203835 A1* 7/2014  Ro .................... G09G 3/006
                                                324/760.02

FOREIGN PATENT DOCUMENTS

| CN | 102109688 A | 6/2011 |
| CN | 102193010 A | 9/2011 |
| CN | 102338943 A | 2/2012 |
| CN | 104360510 A | 2/2015 |
| CN | 204178078 U | 2/2015 |
| JP | 2007-310130 A | 11/2007 |

OTHER PUBLICATIONS

First Chinese Office Action dated Nov. 4, 2016; Appln. No. 201410686133.9.

The Second Chinese Office Action dated Jul. 5, 2017; Appln. No. 201410686133.9.

* cited by examiner

PROBE ASSEMBLY AND DETECTING DEVICE COMPRISING THE SAME

TECHNICAL FILED

Embodiments of the present invention relate to a probe assembly and a detecting device comprising the same.

BACKGROUND

When liquid crystal panels are assembled into a cell, the cell has to be subjected to a detection for any defective product generated during manufacture process so as to prevent failure panels from entering subsequent processes which may lead to a waste of production resource. With a trend that panels are gradually developed to have larger size as well as higher resolution ratio and refresh rate, it usually adopts a routing design of Shorting Bar in larger-sized panels, in order to reduce an influence on detection rate resulted by detecting devices.

It requires narrowing an interval between leads in the panel to improve a resolution ratio of a display device, which also causes a narrowed interval between probes in a probe assembly for use in panel detection. With the reduction of interval between adjacent probes in the probe assembly, a shortcut is likely to be occurred; consequently, it may be unable to detect a defection of the display panel, and hence increases a reject ratio of resulting display panels which may lead to a waste of production materials.

SUMMARY

On one aspect, at least one embodiment of the present invention provides a probe assembly configured to detect a display panel, comprising a first probe region which is corresponding to leads in the display panel and is provided with a first probe, wherein, the first probe is disposed at a location in the first probe region corresponding to a first lead among the leads which are connected in the display panel, and a location in the first probe region corresponding to a lead adjacent to the first lead is not provided with a probe; and the first lead is any one of the leads which are connected in the display panel.

In one example, the probe assembly further comprises a second probe region which is corresponding to lines in a driving circuit in the display panel and is provided with a second probe, wherein, the second probe is disposed at a location in the second probe region corresponding to a first line among the lines applied with a same driving signal, and a location in the second probe region corresponding to a line adjacent to the first line is not provided with a probe; and the first line is any one of the lines applied with a same driving signal.

In one example, an interval between the first probe and the second probe that are adjacent to each other is equal to or larger than 50 µm.

In one example, the probe assembly further comprises a pressure supporter, wherein, the pressure supporter is disposed at a leftmost side and a rightmost side of the probe assembly; and an interval between the pressure supporter and the first probe or second probe that is disposed adjacent to the pressure supporter is equal to or larger than 50 µm.

In one example, a width of the pressure supporter is equal to or larger than 100 µm.

In one example, a material of the pressure supporter is alloy material, silicone material or ceramic material.

In one example, a width of the first probe in the first probe region of the probe assembly is smaller than an interval between adjacent leads in the display panel.

In one example, a width of the second probe in the second probe region of the probe assembly is smaller than an interval between adjacent lines in the driving circuit of the display panel.

In one example, a material of the first probe and the second probe is the same with a material of the pressure supporter.

On the other aspect, at least one embodiment of the present invention further provides a detecting device comprising any of the probe assembly described in terms of the first aspect.

BRIEF DESCRIPTION OF THE DRAWINGS

Embodiments of the present invention will be described in more detail below with reference to the accompanying drawings to enable those skilled in the art to understand the present invention more clearly, wherein.

REFERENCE NUMERALS

1, 9, 10-probe; 2-first probe region; 3-gate line lead; 4-data line lead; 5-contacting hole; 6-design region of short-circuit bar; 7-probing region; 8-second probe region; 11-pressure supporter; 12-line of driving circuit; 13-lead of display panel.

DETAILED DESCRIPTION OF THE PREFERRED EMBODIMENTS

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Embodiments of the present invention provide a probe assembly configured to detect a display panel.

Figure 1:
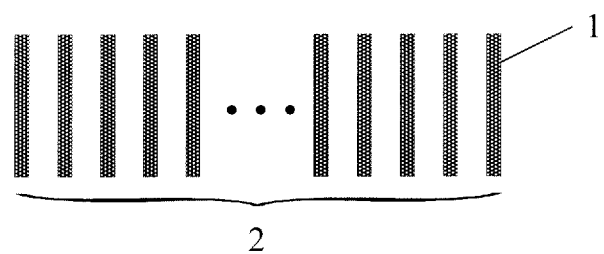
FIG. 1 is a schematic diagram illustrating a structure of a probe assembly provided by an embodiment of the present invention.
Figure 2:
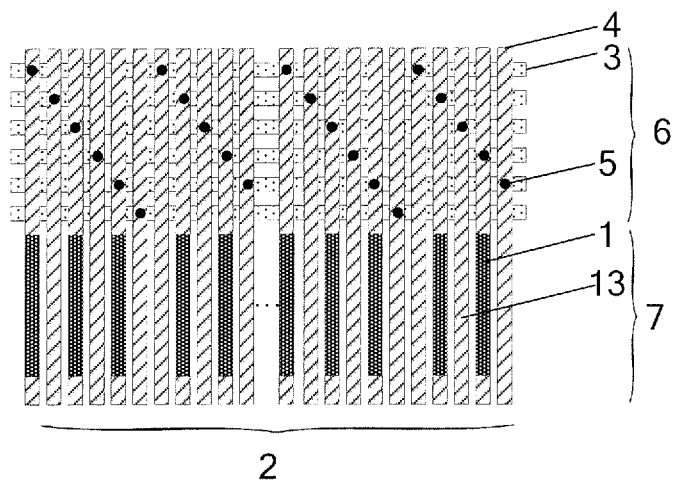
FIG. 2 is a schematic diagram illustrating a detecting structure of a probe assembly provided by an embodiment of the present invention.

Referring to embodiments as illustrated in FIG. 1 and FIG. 2, the probe assembly comprises a first probe region 2 corresponding to leads 13 of the display panel, the first probe region 2 is provided with a probe 1.

As illustrated in FIG. 2, the probe 1 in the first probe region 2 of the probe assembly is disposed at a location corresponding to a first lead among the leads which are connected in the display panel, and a location in the first probe region 2 corresponding to a lead adjacent to the first lead is not provided with the probe 1.

In one example, the first lead is any one of the leads which are connected.

As illustrated in FIG. 2, for a design region 6 of short-circuit bar described by way of example, gate line leads 3 and data line leads 4 are intersected at contacting holes 5, wherein a lead of a first data line, among the data line leads 4 intersected with the gate line leads 3, is connected to a lead of a sixth data line, then the probe 1 is only disposed in a first probe region 2 of the probe assembly corresponding to the lead of the first data line or the lead of the sixth data line. Moreover, the probe 1 is only disposed in a first probe region 2 of the probe assembly corresponding to a lead of one of two adjacent data lines; for example, the probe 1 is only disposed at a location in the first probe region 2 corresponding to the lead of the first data line, while a location corresponding to the lead of the second data line is not provided with the probe 1. In this way, it can be ensured that an interval between adjacent probes in the ultimately resulting probe assembly is equal to or larger than 50 μm so as to prevent from short-circuit occurred between probes in a probing region 7 of the display panel due to factors such as dust during display panel detection.

It should be explained that the present embodiment is merely described with a design of 6D Shorting Bar by way of example without limiting designs for detecting display panels thereto. Instead, in practical application, a location of probe in the probe assembly is not particularly defined, as long as it meets a principle described in the present embodiment.

As above, in embodiments of the present invention, a probe in a first probe region corresponding to a lead in the display panel is disposed at a location corresponding to a first lead among the leads connected in the display panel but not disposed at a location in the first probe region corresponding to a lead adjacent to the first lead, so that an interval between adjacent probes in the ultimately resulting probe assembly configured to detect the display panel is much larger than an interval between adjacent probes in a currently known probe assembly. In this way, when the probe assembly provided by embodiments of the present invention is used for display panel detection, adjacent probes are hardly to be short-connected, which overcomes the problem that the currently known probe assembly may involve a short-circuit between adjacent probes when used for display panel detection, prevents from a condition where a defective display panel cannot be detected, improves the detection rate, and ensures an image quality of the display panel; further, it can avoid a waste of production material and thus reduce a production cost.

Figure 3:
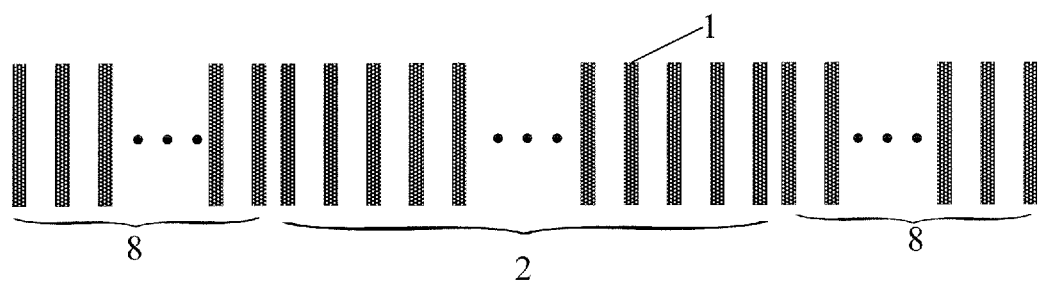
FIG. 3 is a schematic diagram illustrating a structure of another probe assembly provided by an embodiment of the present invention.
Figure 6:
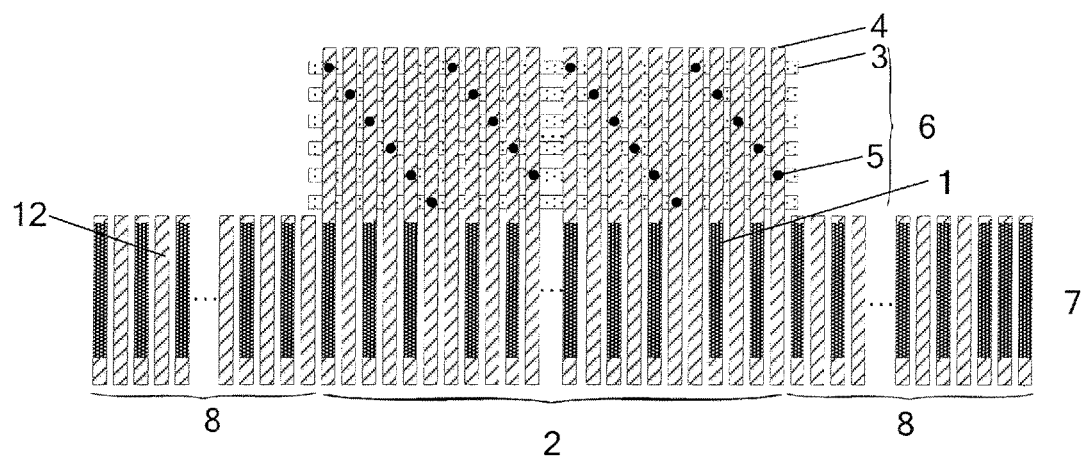
FIG. 6 is a schematic diagram illustrating a detecting structure of another probe assembly provided by an embodiment of the present invention.

With reference to another embodiment as illustrated in FIG. 3 and FIG. 6, the probe assembly further comprises a second probe region 8 corresponding to lines 12 in a driving circuit of the display panel, wherein the second probe region 8 is provided with a probe 1.

As illustrated in FIG. 3 and FIG. 6, the probe 1 in the second probe region 8 of the probe assembly is disposed at a location corresponding to a first line among the lines applied with a same driving signal; and a location in the second probe region 8 corresponding to a line adjacent to the first line is not provided with the probe 1.

In one example, the first line is any one of the lines applied with the same driving signal.

In one example, an interval between adjacent probes 1 in the second probe region 8 can be equal to or larger than 50 μm so as to ensure that a short-circuit will not be occurred between probes 1 in the second probe region 8 due to factors such as dust during a display panel detection; in this way, it avoids the problem that a performance condition of the driving circuit supplying the display panel with the driving signal, whether good or bad, cannot be detected, and hence ensures an excellent performance of the display panel.

Figure 4:
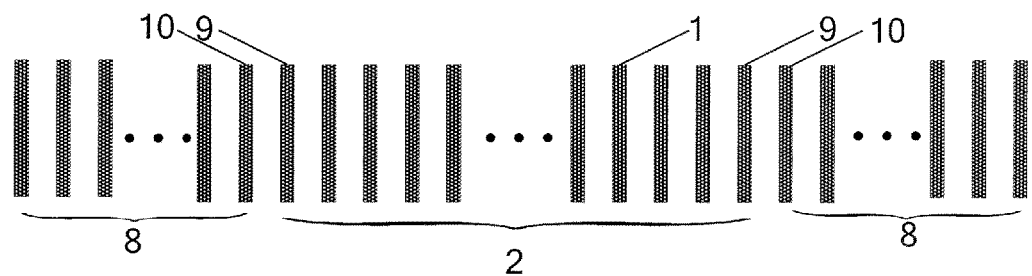
FIG. 4 is a schematic diagram illustrating a structure of yet another probe assembly provided by an embodiment of the present invention.

With reference to FIG. 4, it illustrates the first probe region 2 and the second probe region 8 which are disposed adjacently in the probe assembly, wherein a probe located at an intersection of two probe regions is indicated by probe 9 and probe 10; that is, the probe 9 in the first probe region 2 and the probe 10 in the second probe region 8 are disposed to be adjacent one another. In one example, it needs to ensure that an interval between the probe 9 in the first probe region 2 and the probe 10 in the second probe region 8 is equal to or larger than 50 μ. so as to avoid short-circuit occurred between adjacent probes; in this way, it ensures that the probe assembly as provided by embodiments of the present invention can be well utilized to detect a display panel, which in turn ensures a complete functionality of the probe assembly and a performance of the display panel subjected to the detection, for example, the image quality of the display panel.

Figure 5:
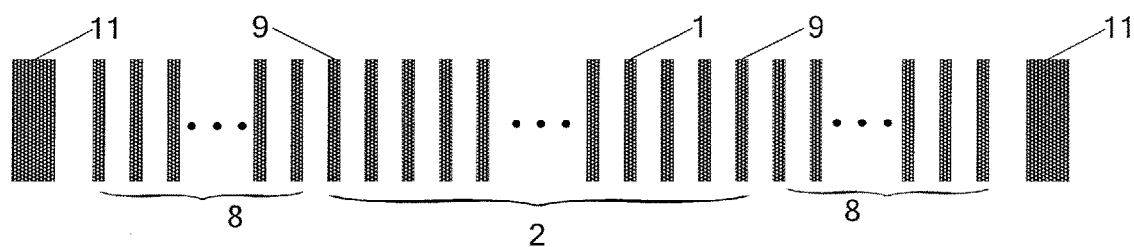
FIG. 5 is a schematic diagram illustrating a structure of still another probe assembly provided by an embodiment of the present invention.

In one example, with reference to FIG. 5, the probe assembly further comprises a pressure supporter 11 which is disposed at a leftmost side and a rightmost side of the probe assembly.

In one example, an interval between the pressure supporter 11 and a probe in the probe assembly that is disposed adjacent to the pressure supporter 11 is equal to or larger than 50 μm.

A working table for use in display panel detection is usually hollow in its middle portion. As a result, a larger-sized display penal, when subjected to detection, will present a bending curve invisible for human eyes, which may lead to asynchronous force or uneven force bear by the probes disposed at different sides of the probe assembly, and hence considerably reduce the service life of the probe assembly. The probe assembly provided by embodiments of the present invention is additionally provided with a pressure supporter 11 at a leftmost side and a rightmost side thereof, so that the whole probe assembly is well supported by the pressure supporter 11, which further prevents the probe assembly from bending and hence extends the service life of the probe assembly.

In one example, a width of the pressure supporter 11 is equal to or larger than 100 μm. For example, the width of the pressure supporter 11 can be 100-150 μm.

In one example, the pressure supporter 11 is made of alloy material, silicone material or ceramic material.

For example, the pressure supporter 11 can be made of a material which is the same with or different from a material of the probe of the probe assembly, for example, an alloy material.

In one example, a width of the probe 1 in the first probe region 2 is smaller than an interval between adjacent leads in the display panel.

In one example, a width of the probe 1 in the second probe region 8 is smaller than an interval between adjacent lines in the driving circuit of the display panel.

As for a display panel detection using the probe assembly, because a subsequent process of alignment between display panel and probe assembly is achieved by automatic recognition of alignment marks, the display panel or a detecting device equipped with the probe assembly may have a displacement due to certain uncontrollable factors in actual detection; as a result, the probe of the probe assembly may be placed at a location between leads or between lines of the driving circuit, which may also lead to short-circuit in the probe assembly and a need of replacing the probe assembly with a new one for detection. By contrast, in an example of the probe assembly as provided by the present embodiment, a width of the probe in the first probe region is smaller than an interval between adjacent lines in the display panel, and a width of the probe in the second probe region is smaller than an interval between adjacent lines in the driving circuit of the display panel; in this way, the probe assembly as provided by embodiments of the present invention will never involve a short-circuit even when the probe falls onto an area between leads or between lines in the driving circuit due to force majeure; moreover, it can restart a detection merely by adjusting a location of the probe assembly without replacing the probe assembly with a new one, so that the production efficiency is improved and the production cost is reduced.

As above, in embodiments of the present invention, the probe in the first probe region corresponding to the lead in the display panel is disposed at a location corresponding to the first lead among leads connected in the display but not disposed at a location in the first probe region corresponding to the lead adjacent to the first lead, so that the ultimately resulting probe assembly configured to detect the display panel has an interval between two adjacent probes much larger than an interval between adjacent probes in the currently known probe assembly; in this way, when used for display panel detection, the probe assembly provided by embodiments of the present invention will never involve short-circuit between adjacent probes, which avoids a condition where a defective display panel cannot be detected, improves the detection rate and ensures the image quality of the display panel; furthermore, it avoids a waste of production material and reduces the production cost.

Embodiments of the present invention further provide a detecting device comprising any probe assembly described in the above embodiments with reference to FIGS. 1-6.

In the detecting device as provided by embodiments of the present invention, the probe in the first probe region corresponding to the lead in the display panel is disposed at a location corresponding to the first lead among the leads connected in the display but not disposed at a location in the first probe region corresponding to the lead adjacent to the first lead, so that the ultimately resulting probe assembly configured to detect the display panel has an interval between two adjacent probes much larger than an interval between adjacent probes in the currently known probe assembly; in this way, when used for display panel detection, the probe assembly provided by embodiments of the present invention will never involve short-circuit between adjacent probes, which avoids a condition where a defective display panel cannot be detected, improves the detection rate and ensures the image quality of the display panel; furthermore, it avoids a waste of production material and reduces the production cost.

It is understood that the described above are just exemplary implementations and embodiments to explain the principle of the present invention and the invention is not intended to be limited thereto. An ordinary person in the art can make various variations and modifications to the present invention without departure from the spirit and the scope of the present invention, and such variations and modifications shall fall in the scope of the present invention.

The present application claims the priority of China patent application No. 201410686133.9 filed on Nov. 24, 2014 titled "A PROBE MODULE FOR USE IN DETECTION AND A DETECTING DEVICE THEREOF", which is incorporated herein by reference in its entirely.

What is claimed is:

1. A probe assembly configured to detect a display panel, the display panel comprising display region lines parallel to each other, of a same type, disposed in a display region of the display panel,
    the probe assembly comprising a first probe region which is corresponding to leads of the display region lines of the same type and is provided with a first probe, wherein,
    for every two adjacent leads among the leads of the display region lines of the same type which are connected in the display panel, only one lead is provided with the first probe and the other one of the two adjacent leads is not provided with the first probe,
    the probe assembly further comprising a pressure supporter, wherein,
    the pressure supporter is disposed at a leftmost side and a rightmost side of the probe assembly; and
    an interval between the pressure supporter and the first probe disposed adjacent to the pressure supporter in the probe assembly is equal to or larger than 50 μm.

2. The probe assembly of claim 1, wherein the display panel further comprises driving circuit lines of a driving circuit disposed in a non-display region of the display panel, the driving circuit lines are applied with a same driving signal,
    the probe assembly further comprising a second probe region which is corresponding to the driving circuit lines applied with the same driving signal and is provided with a second probe, wherein,
    for every two adjacent driving circuit lines among the circuit lines applied with the same driving signal, only one driving circuit line is provided with the second probe and the other one of the two adjacent driving circuit lines is not provided with the second probe, and
    an interval between the pressure supporter and the second probe disposed adjacent to the pressure supporter in the probe assembly is equal to or larger than 50 μm.

3. The probe assembly of claim 2, wherein,
an interval between the first probe and the second probe that are adjacent to each other is equal to or larger than 50 μm.

4. The probe assembly of claim 1, wherein a width of the pressure supporter is equal to or larger than 100 μm.

5. The probe assembly of claim 1, wherein a material of the pressure supporter is alloy material, silicone material or ceramic material.

6. The probe assembly of claim 1, wherein a width of the first probe in the first probe region of the probe assembly is smaller than an interval between adjacent leads of display region lines in the display panel.

7. The probe assembly of claim 2, wherein a width of the second probe in the second probe region of the probe assembly is smaller than an interval between adjacent lines in the driving circuit of the display panel.

8. The probe assembly of claim 2, wherein a material of the first probe and the second probe in the probe assembly is the same as a material of the pressure supporter.

9. A detecting device, comprising a probe assembly configured to detect a display panel, the display panel comprising display region lines parallel to each other, of a same type, disposed in a display region of the display panel, wherein the probe assembly comprises a first probe region which is corresponding to leads of the display region lines of the same type and is provided with a first probe, wherein,
for every two adjacent leads among the leads of the display region lines of the same type which are connected in the display panel, only one lead is provided with the first probe and the other one of the two adjacent leads is not provided with the first probe,
the probe assembly further comprising a pressure supporter, wherein,
the pressure supporter is disposed at a leftmost side and a rightmost side of the probe assembly; and
an interval between the pressure supporter and the first probe disposed adjacent to the pressure supporter in the probe assembly is equal to or larger than 50 μm.

10. The detecting device of claim 9, wherein the display panel further comprises driving circuit lines of a driving circuit disposed in a non-display region of the display panel, the driving circuit lines are applied with a same driving signal,
wherein the probe assembly further comprises a second probe region which is corresponding to the driving circuit lines applied with the same driving signal and is provided with a second probe, wherein,
for every two adjacent driving circuit lines among the driving circuit lines applied with the same driving signal, only one driving circuit line is provided with the second probe and the other one of the two adjacent driving circuit lines is not provided with the second probe, and
an interval between the pressure supporter and the second probe disposed adjacent to the pressure supporter in the probe assembly is equal to or larger than 50 μm.

11. The detecting device of claim 10 wherein an interval between the first probe and the second probe that are adjacent to each other is equal to or larger than 50 μm.

12. The detecting device of claim 9, wherein a width of the pressure supporter is equal to or larger than 100 μm.

13. The detecting device of claim 9, wherein a material of the pressure supporter is alloy material, silicone material or ceramic material.

14. The detecting device of claim 9, wherein a width of the first probe in the first probe region of the probe assembly is smaller than an interval between adjacent leads of display region lines in the display panel.

15. The detecting device of claim 10, wherein a width of the second probe in the second probe region of the probe assembly is smaller than an interval between adjacent lines in the driving circuit of the display panel.

16. The detecting device of claim 10, wherein a material of the first probe and the second probe in the probe assembly is the same as a material of the pressure supporter.

* * * * *